United States Patent [19]
Mand

[11] Patent Number: 4,847,665
[45] Date of Patent: Jul. 11, 1989

[54] MONOLITHIC INTEGRATION OF OPTOELECTRONIC AND ELECTRONIC DEVICES

[75] Inventor: Ranjit S. Mand, Nepean, Canada

[73] Assignee: Northern Telecom Limited, Montreal, Canada

[21] Appl. No.: 176,120

[22] Filed: Mar. 31, 1988

[51] Int. Cl.[4] .......................................... H01L 31/00
[52] U.S. Cl. ..................................... 357/16; 357/19; 357/56; 357/55; 357/30; 372/50; 350/96.12
[58] Field of Search ............... 357/16, 19, 30 F, 30 E, 357/30 P, 56, 55; 372/50; 350/96.12

[56] References Cited
U.S. PATENT DOCUMENTS

4,720,468  1/1988  Menigaux ............................ 357/19

OTHER PUBLICATIONS

Lasahar, K. "Double Meterostructure optoelectronic switch as a dynamic memory with low power comsumption" 2/29/88, 52(9), Appl. Phys. Letters.
Kasahar, K. "Double Heterostructure Optoelectronic Switch as a Dynamic Memory with Low Power Comsumption", 2/29/88, 52(9), Appl. Phys. Letters.
Wada et al, IEEE Journal of Quantum Electronics, vol. QE-22, No. 6, Jun. 1986, pp. 805-821.
Maeda et al, Hitachi Review, vol. 35, No. 4, 1986, pp. 213-218.
Shibata et al, Appl. Phys. Lett. 45(3), Aug. 1, 1984, pp. 191-193.
Taylor et al, IEEE Trans. Electron Dev., vol. ED-32, No. 11, Nov. 1985, pp. 2345-2367.
Taylor et al, Electron. Lett., vol. 22, No. 15, Jul. 1986, pp. 784-786.
Taylor et al, Electron. Lett., vol. 23, No. 2, Jan. 1987, pp. 77-79.
Simmons et al, Electron. Lett, vol. 22, Oct. 1986, pp. 1167-1169.
Simmons et al, Electron. Lett., vol. 23, No. 8, Apr. 1987, pp. 380-382.
Taylor et al, Appl. Phys. Lett. 50(24), Jun. 1987, pp. 1754-1756.
Taylor et al, J. Appl. Phys. 59(2), Jan. 1986, pp. 596-600.
Taylor et al, Appl. Phys. Lett. 48(20), May 1986, pp. 1368-1370.
Taylor et al, Appl. Phys. Lett. 49(21), Nov. 1986, pp. 1406-1408.
Simmons et al, IEEE Trans. Electron. Dev., vol. ED-34, No. 5, May 1987, pp. 973-984.

Primary Examiner—Andrew J. James
Assistant Examiner—David Soltz
Attorney, Agent, or Firm—C. W. Junkin

[57] ABSTRACT

In the monolithic integration of HFET and DOES devices, a wide band gap carrier confining semiconductor layer is provided only at predetermined locations where DOES devices are desired. This layer is not provided at other predetermined locations where HFET devices are desired as it would constitute a shunt path which would degrade the high frequency operation of the HFET devices. The invention is particularly useful where monolithic integration of optical sources, optical detectors, and electronic amplifying or switching elements is desired.

17 Claims, 5 Drawing Sheets

MONOLITHIC INTEGRATION OF OPTOELECTRONIC AND ELECTRONIC DEVICES

The present invention relates generally to monolithic integration of optoelectronic and electronic devices. More particularly, the invention relates to monolithic integration of DOES and HFET devices.

A number of recent publications disclose the desirability of integrating both optoelectronic devices and electronic devices on a single monolithic substrate. See for example Wada et al, IEEE Journal of Quantum Electronics, Vol. QE-22, No. 6, June 1986, pp 805–821; Nakamura et al, IEEE Journal of Quantum Electronics, Vol. QE-22, No. 6, June 1986, pp 822–826; Maeda et al, Hitachi Review, Vol. 35, No. 4, 1986, pp 213–18; and Shibata et al, Appl. Phys. Lett. 45(3), Aug. 1, 1984, pp 191–193. These advantages include higher speed operation and better noise performance due to reduction of parasitic reactances, and higher system reliability and simpler system assembly due to reduction of system parts counts.

Unfortunately, the semiconductor layers required for the construction of most optoelectronic devices differ from the semiconductor layers required for the construction of most electronic devices. As a result, optoelectronic devices have been integrated onto the same substrate as electronic devices by growing the semiconductor layers required for optoelectronic devices onto a semiconductor substrate, etching the grown layers to expose the semiconductor substrate at locations where electronic devices are desired while masking the grown layers at locations where optoelectronic devices are desired, and forming electronic devices in the substrate and optoelectronic devices in the grown layers.

This procedure is rather complicated and has significant disadvantages. In particular, the grown layers protrude beyond the surface of the exposed substrate so that masks used to define the electronic devices are held away from the substrate surface during photolithography. This limits the resolution of the photolithography process and correspondingly limits the density of the electronic devices Moreover, the electronic devices are formed at an etched surface of the substrate. The etching process degrades the quality of this surface and this affects the functioning of the resulting electronic devices. In particular, field effect transistors (FETs) formed at such an etched surface typically have nonuniform threshold voltages. Both of the above effects limit the yield of such integration processes.

In another known method for integrating optoelectronic devices onto the same substrate as electronic devices, a groove is formed in the substrate and the semiconductor layers required for optoelectronic devices are grown only in the groove. Optoelectronic devices are then formed in the groove, while electronic devices are formed on the substrate alongside the groove. Unfortunately, the groove required for this process must be made 5 microns to 10 microns deep in order to accommodate all of the semiconductor layers required for optoelectronic devices, and a step discontinuity of this magnitude impairs the resolution of photolithographic processes used to define the optoelectronic and electronic devices.

Recent publications have disclosed a family of electronic and optoelectronic devices including the Bipolar Inversion Channel Field Effect Transistor (BICFET), Heterojunction Field Effect Transistor (HFET), Heterostructure Junction Field Effect Transistor (HJFET), HFET PhotoDetector (HFETPD) and Double heterostructure OptoElectronic Switch (DOES). See for example Taylor et al, IEEE Trans. Electron Dev., Vol. ED-32, No. 11, November 1985, pp 2345–2367; Taylor et al, Electron. Lett., Vol. 22, No. 15, July 1986, pp 784–786; Taylor et al, Electron Lett , Vol. 23, No. 2, January 1987, pp 77–79; Simmons et al, Electron. Lett., Vol. 22, No. 22, October 1986, pp 1167–1169; Simmons et al, Electron. Lett., Vol. 23, No. 8, April 1987, pp 380–382; Taylor et al, Appl. Phys. Lett. 50(24), June 1987, pp 1754–1756; Taylor et al, J. Appl. Phys. 59(2), January 1986, pp 596–600; Taylor et al, Appl. Phys. Lett. 48(20), May 1986, pp 1368–1370; Taylor et al, Appl. Phys Lett. 49(21), November 1986, pp 1406–1408; and Simmons et al, IEEE Trans. Electron Dev., Vol. ED-34, No. 5, May 1987, pp 973–984.

The present invention seeks to provide a method for monolithically integrating DOES devices and HFET devices which overcomes some or all of the problems encountered in known methods for monolithically integrating optoelectronic devices with electronic devices. The term "HFET devices" as used in this specification is meant to encompass HFET transistors, HFET photodetectors (HFETPDs) and other similar devices.

According to one aspect of the present invention there is provided a method for making a monolithic integrated circuit comprising DOES devices and HFET devices, the method comprising:

forming a semi-insulating substrate having regions of wide band gap semiconductor of a first conductivity type recessed therein at predetermined locations, the regions being exposed at a surface of the substrate;

forming a layer of narrow band gap semiconductor having a second conductivity type opposite to the first conductivity type over the surface of the substrate;

forming a sheet charge of the first conductivity type over the layer of narrow band gap semiconductor;

forming a layer of wide band gap semiconductor of the second conductivity type over the sheet charge; and forming ohmic contacts to the layer of wide band gap semiconductor of the second conductivity type and to the layer of wide band gap semiconductor of the first conductivity type to define DOES devices at the predetermined locations, and forming HFET devices at other predetermined locations.

According to another aspect of the invention there is provided a monolithic integrated circuit comprising:

a semi-insulating substrate having regions of wide band gap semiconductor of a first conductivity type recessed therein at specific locations;

a layer of narrow band gap semiconductor on the substrate, the narrow band gap semiconductor having a second conductivity type opposite to the first conductivity type and contacting the regions of wide band gap semiconductor;

a sheet charge of the first conductivity type on the layer of narrow band gap semiconductor;

a layer of wide band gap semiconductor of the second conductivity type on the sheet charge; and ohmic contacts to the layer of wide band gap semiconductor of the second conductivity type and to the layer of wide band gap semiconductor of the first conductivity type defining DOES devices at the specific locations, and HFET devices formed in the semiconductor layers at other specific locations.

The wide band gap semiconductor of the first conductivity type is provided only at those predetermined locations where DOES devices are desired. This material is provided for carrier confinement in the overlying narrow band gap semiconductor of the second conductivity type as is required for efficient light generation in the DOES devices. This material is not provided at other predetermined locations where HFET devices are desired as it would constitute a shunt path which would degrade the high frequency operation of the HFET devices.

Because most of the semiconductor layers are common to the optoelectronic and electronic devices, there is little or no step discontinuity between the optoelectronic and electronic devices. Thus, standard photolithographic procedures may be used with little or none of the impairment encountered in the previously known methods of integration described above. Moreover, the HFET devices are formed at a grown or deposited surface of the substrate rather than at an etched surface. As a result, the HFET devices have relatively uniform threshold voltages.

Preferably, ohmic contacts are formed to the wide band gap semiconductor of the second conductivity type by forming a layer of heavily doped wide band gap semiconductor of the second conductivity type on the wide band gap semiconductor of the second conductivity type at the predetermined locations, forming a layer of heavily doped narrow band gap semiconductor of the second conductivity type on the heavily doped wide band gap semiconductor of the second conductivity type, and forming a metallic layer on the heavily doped narrow band gap semiconductor. The heavily doped wide band gap semiconductor of the second conductivity type, heavily doped narrow band gap semiconductor of the second conductivity type, and the metal together constitute the ohmic contact to the wide band gap semiconductor of the second conductivity type.

Where the semi-insulating substrate is of narrow band gap material, regions of narrow band gap semiconductor of the first conductivity type are provided beneath the regions of wide band gap semiconductor of the first conductivity type. The narrow band gap semiconductor of the first conductivity type acts as a buffer layer to ensure high quality crystal structure in the overlying wide band gap semiconductor of the first conductivity type. Moreover, the narrow band gap semiconductor of the first conductivity type may be heavily doped, and portions of this material may be exposed and coated with a metallic layer to form an ohmic contact to the wide band gap semiconductor of the first conductivity type, the metallic layer and the heavily doped narrow band gap semiconductor of the first conductivity type constituting the ohmic contact.

Recesses may be etched into the substrate at the predetermined locations and the layers of narrow band gap semiconductor and wide band gap semiconductor of the first conductivity type may be formed so as to substantially fill the recesses. These recesses may be an order of magnitude shallower than the grooves used in previously known integration methods described above since they need only accommodate one or two of the semiconductor layers required for optoelectronic devices. The grooves used in the previously known integration methods must accommodate all of the semiconductor layers required for optoelectronic devices and therefore must be deeper.

Alternatively, layers of narrow band gap semiconductor and wide band gap semiconductor of the first conductivity type may be formed over the entire substrate and oxygen may be implanted at the other predetermined locations to render the narrow band gap semiconductor and wide band gap semiconductor at said other predetermined locations semi-insulating. Both of these approaches eliminate or reduce protrusion of the DOES devices beyond the HFET devices due to additional carrier confinement layers in the DOES devices.

Embodiments of the invention will now be described by way of example only with reference to the accompanying drawings in which.

In the description which follows, "N" and "P" designate doping to a level between $10^{16}$ and $10^{18}$ carriers per cubic centimeter, "N-" and "P-" designate doping to a level between $10^{15}$ and $10^{16}$ carriers per cubic centimeter and "N+" and "P+" designate doping to a level between $10^{18}$ and $10^{19}$ carriers per cubic centimeter.

In a first embodiment, a monolithic integrated circuit comprising DOES and HFET devices is manufactured according to a series of process steps shown in FIGS. 1 to 6.

Figure 1:
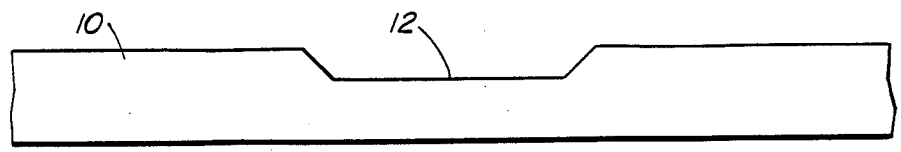
FIGS. 1 to 6 are cross-sectional views of a monolithic integrated circuit according to a first embodiment at successive, stages in its manufacture.

As shown in FIG. 1, a substantially planar semiinsulating GaAs substrate 10 is masked with photoresist and etched to define recesses 12 approximately 5000 angstroms deep at predetermined locations where DOES devices are desired.

Figure 2:
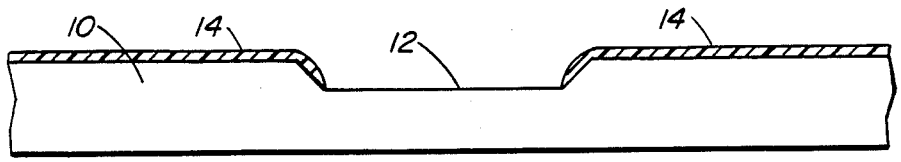

As shown in FIG. 2, a layer 14 of silicon nitride is deposited on the substrate 10, masked with photoresist and etched to remove the silicon nitride only from the recesses 12.

Figure 3:
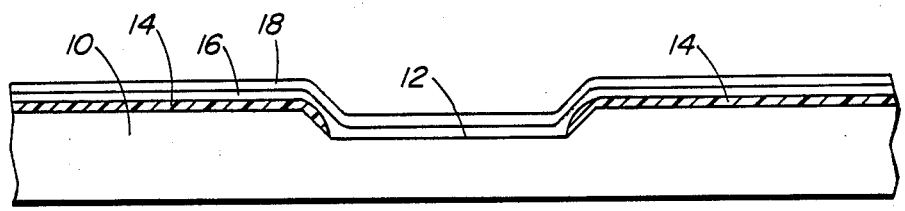

A shown in FIG. 3, a layer of narrow band gap semiconductor of a first conductivity type in the form of a N+GaAs layer 16 approximately 2000 angstroms thick and doped with approximately 5x1018 silicon atoms per cubic centimeter. is deposited by molecular beam epitaxy (MBE) over the silicon nitride layer 14 and recess 12. The N+GaAs layer 16 is polycrystalline where it is grown on the silicon nitride layer 14 and monocrystalline in the recess 12 where it is grown directly on the semi-insulating GaAs substrate 10. As further shown in FIG. 3, a layer of wide band gap semiconductor of the first conductivity type in the form of a N+GaAlAs layer 18 approximately 3000 angstroms thick and doped with approximately $5 \times 10^{18}$ silicon atoms per cubic centimeter is deposited by MBE over the layer 16 of N+GaAs. The composition of the GaAlAs layer 18 is ramped from $Ga_{1.0}Al_{0.0}As$ to $Ga_{0.7}Al_{0.3}As$ over the first approximately 100 angstroms of the layer. Like the N+GaAs layer 16, the N+GaAlAs layer 18 is monocrystalline in the recess 12 and polycrystalline elsewhere according to the crystallinity of the underlying material.

Figure 4:

As shown in FIG. 4, the layers 14, 16 and 18 are preferentially etched to preferentially remove polycrystalline material, leaving only the monocrystalline N+GaAs and N+GaAlAs layers 16, 18 in the recess 12. The remaining N+GaAs and GaAlAs layers 16, 18 substantially fill the recess 12.

Figure 5:
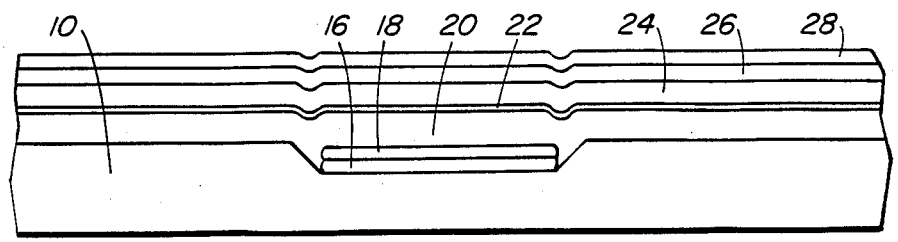

As shown in FIG. 5, a further series of monocrystalline layers 20, 22, 24, 26, 28 are deposited over the N+GaAs and GaAlAs layers 16, 18 and over exposed portions of the substrate 10 by MBE. A layer of narrow band gap semiconductor of a second conductivity type in the form of a layer 20 of P−GaAs approximately 1 micron thick and doped with approximately $5 \times 10^{15}$ beryllium atoms per cubic centimeter is deposited directly on the N+GaAlAs layer 18 and substrate 10. A sheet charge in the form of a layer 22 of N+Ga$_{0.7}$Al$_{0.3}$As approximately 40 angstroms thick and doped with approximately $10^{19}$ silicon atoms per cubic centimeter is deposited on the P−GaAs layer 20.

A layer of wide band gap semiconductor of the second conductivity type in the form of a layer 24 of P Ga$_{0.7}$Al$_{0.3}$As approximately 350 angstroms thick and doped with approximately $10^{17}$ beryllium atoms per cubic centimeter is deposited on the sheet charge layer 22.

Two further layers 26, 28 used in formation of ohmic contacts to the P GaAlAs layer 24 are formed over the P GaAlAs layer 24. These layers include a layer of heavily doped wide band gap semiconductor of the second conductivity type in the form of a P+Ga$_{0.7}$Al$_{0.3}$As layer 26 approximately 500 angstroms thick and doped with approximately $10^{19}$ beryllium atoms per cubic centimeter deposited by MBE directly on the P GaAlAs layer 24, and a layer of heavily doped narrow band gap semiconductor of the second conductivity type in the form of a P+GaAs layer 28 approximately 500 angstroms thick and doped with approximately $10^{19}$ beryllium atoms per cubic centimeter deposited by MBE on the P+GaAlAs layer 26.

Figure 6:
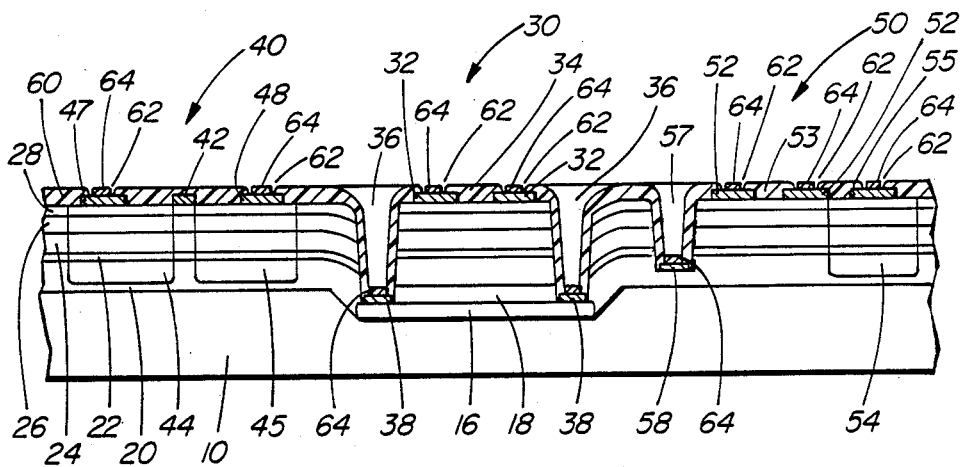

DOES devices are defined at those predetermined locations where recesses 12 were formed and substantially filled with N+GaAs and GaAlAs layers 16, 18. Such a DOES device 30 is shown in FIG. 6. The DOES device 30 is defined by forming ohmic contacts to the layer 24 of P GaAlAs and to the layer 18 of N+GaAlAs. The ohmic contact to the layer 24 of P GaAlAs defines an emitter electrode of the DOES device and is completed depositing a metallic layer 32 on the P+GaAs layer 28 over the recesses 12, the metallic layer 32 and the P+ semiconductor layers 26, 28 constituting the ohmic contact. An opening 34 is formed in the metallic layer 32 for transmission of light to and from the DOES device. The ohmic contact to the layer 18 of N+GaAlAs defines a collector electrode of the DOES device and is formed by masking with photoresist and etching to form recesses 36 extending through the P+GaAs layer 28, P+GaAlAs layer 26, P GaAlAs layer 24, N+GaAlAs sheet charge layer 22, P−GaAlAs layer 20 and N+GaAlAs layer 18 to expose portions of the N+GaAs layer 16, and forming a metallic layer 38 in the recesses 36. The metallic layer 38 and N+GaAs layer 16 together constitute the ohmic contact to the N+GaAlAs layer HFET devices in the form of HFET transistors are formed at other predetermined locations in the semiconductor layers 20, 22, 24, 26 and 28. Such a HFET transistor 40 is shown in FIG. 6. The HFET transistor 40 is formed by depositing a metallic gate electrode 42, implanting silicon into the semiconductor layers 20, 22, 24, 26 and 28 and rapid thermal annealing to activate the silicon, thereby defining self-aligned N+ source and drain regions 44, 45, and depositing metallic source and drain electrodes 47, 48 over the source and drain regions respectively.

HFET devices in the form of HFETPDs are formed at still other predetermined locations in the semiconductor layers 20, 22, 24, 26 and 28. Such a HFETPD 50 is shown in FIG. 6. The HFETPD 50 is formed by depositing a metallic gate electrode 52, implanting silicon into the semiconductor layers 20, 22, 24, 26 and 28 and rapid thermal annealing to activate the silicon, thereby defining a self-aligned N+ anode region 54, and depositing a metallic anode 55 over the anode region 54. An opening 53 is formed in the gate electrode 52 for transmission of light to the HFETPD. The HFETPD is completed by masking with photoresist and etching to define a recess 57 extending through the P+GaAs layer 28, P+GaAlAs layer 26, P GaAlAs layer 24 and N+GaAlAs sheet charge layer 22 to expose portions of the P−GaAs layer 20, and forming a metallic cathode 58 in the recess 57.

To minimize the required number of process steps, the DOES and HFET devices are formed together rather than in succession. In particular, all of the gate metal layers 32, 42 and 52 are formed in a single metallization step, followed by implantation of all of the self-aligned source, drain and anode regions in a single implantation step. All of the collector, source, drain and anode contacts 38, 47, 48 and 55 are then made in a second single metallization step, and the cathode contact is made in a separate metallization step.

A layer 60 of silicon nitride is formed by chemical vapour deposition (CVD) over the DOES and HFET devices, and openings 62 are etched through this layer over the contacts 32, 38, 42, 47, 48, 52, 55, 58. A metallic layer 64 is formed over the silicon nitride and contacts using known lift off techniques to define contact pads 66 for the DOES and HFET devices.

Where isolation between adjacent HFET devices is required, known isolation techniques employing mesa etching or boron implantation may be used.

The DOES and HFET devices described above operate essentially as described in Taylor et al, J. Appl. Phys. 59(2), January 1986, pp 596–600, Taylor et al, Electronics Letters, Vol. 22, No. 15, July 1986, pp 784–786 and Taylor et al, Appl Phys. Lett. 50(24), June 1987, pp 1754–1756.

Figure 7:
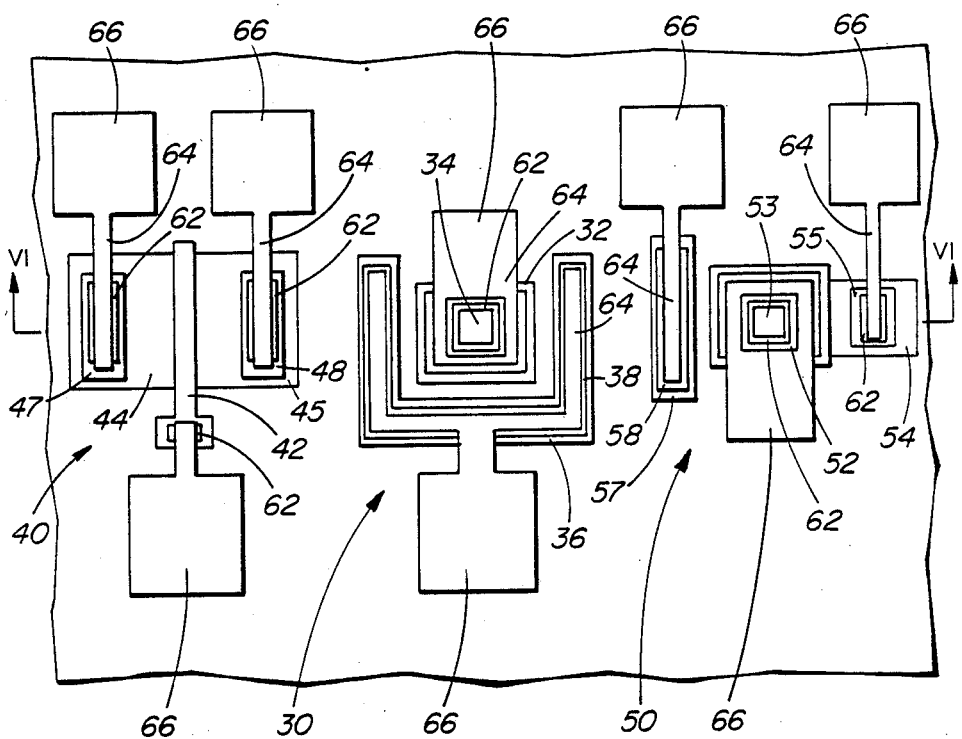
FIG. 7 is a top elevational view of the integrated circuit of FIGS. 1 to 6.

A plan view of the resulting devices is shown in FIG. 7.

Figure 8:
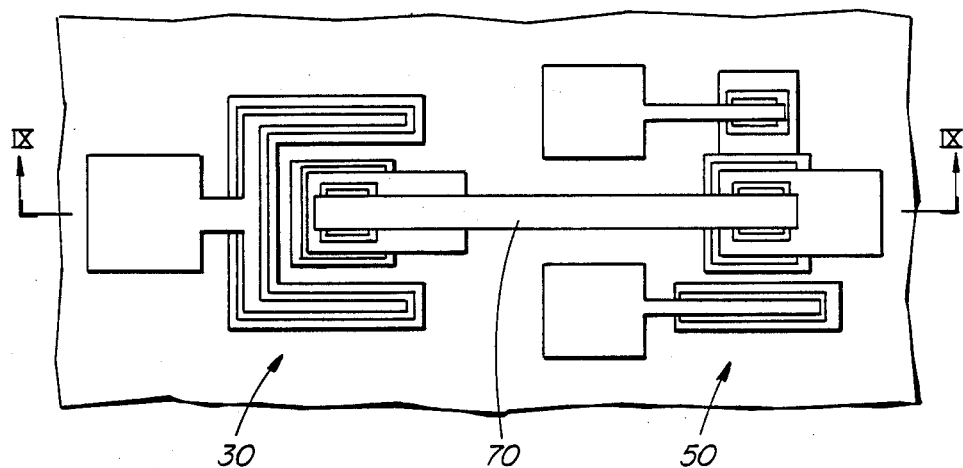
FIG. 8 is a top elevational view of a monolithic integrated circuit according to a second embodiment.
Figure 9:
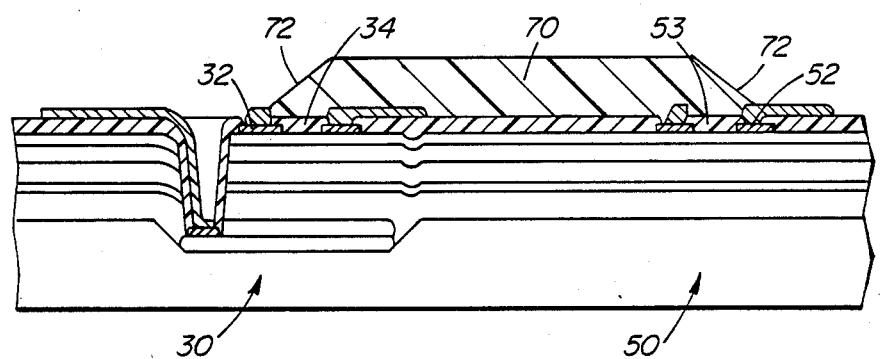
FIG. 9 is cross-sectional view of the integrated circuit of FIG. 9 taken on section line IX—IX of FIG. 8.

A monolithic integrated circuit according to a second embodiment is shown in FIGS. 8 and 9. This integrated circuit comprises a DOES device 30 and a HFETPD device 50 fabricated as described above. The DOES device 30 and the HFETPD device 50 are optically interconnected by means of a polymer layer 70 formed at an upper surface of the integrated circuit so as to form an optical waveguide. The polymer layer 70 is formed with tapered end portions 72 provided with a mirror finish over the openings 34, 53 in the DOES emitter electrode 32 and the HFETPD gate electrode 52 so as to couple light emerging from the emitter opening 34 of the DOES device 30 along the polymer layer 70 and through the gate opening 53 of the HFETPD device 50.

Figure 10:
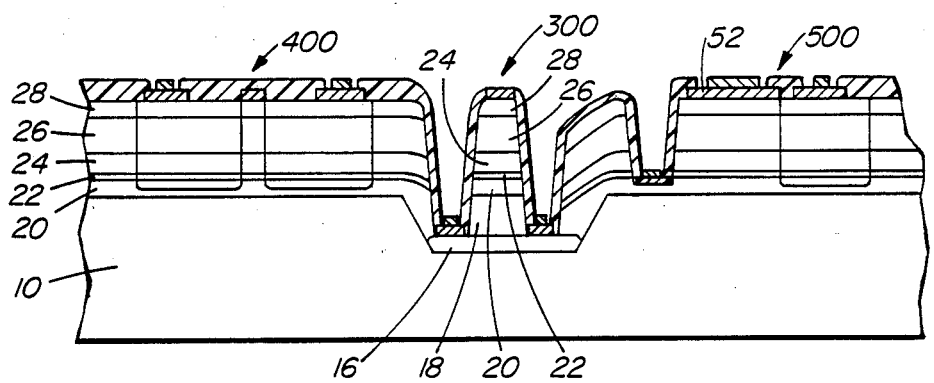
FIG. 10 is a cross-sectional view of a monolithic integrated circuit according to a third embodiment.
Figure 11:
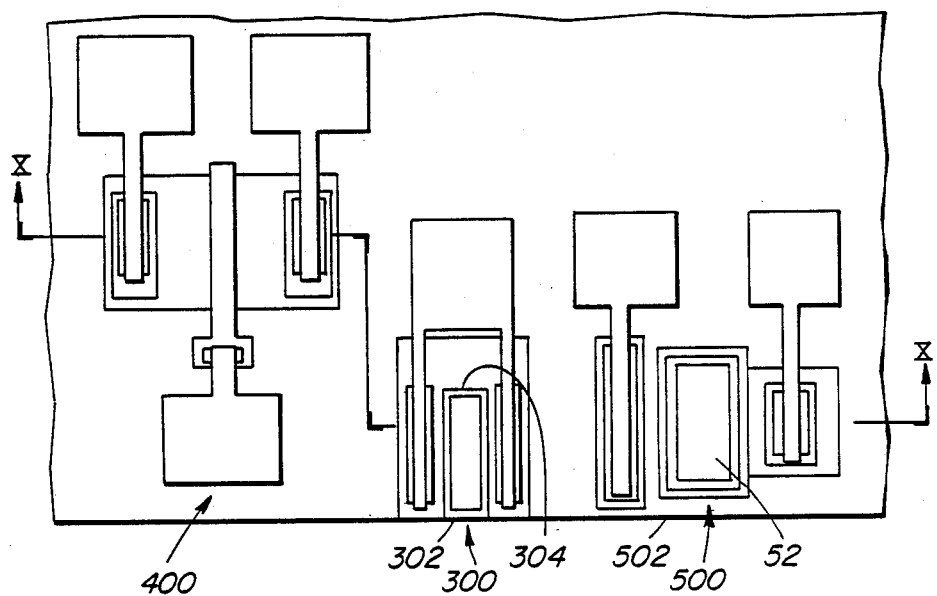
FIG. 11 is a plan view of the monolithic integrated circuit of FIG. 10.

The DOES device 30 of the embodiments described above operates as a light emitting diode (LED). A third embodiment shown in FIGS. 10 and 11 comprises a monolithic integrated circuit having a DOES device 300 capable of operation as a laser. This monolithic integrated circuit is fabricated as described above for the first embodiment, except that the N+GaAlAs layer 18 is made 1 micron thick (instead of 3000 angstroms as in the first embodiment), the P−GaAlAs layer 20 is made 1000 angstroms thick (instead of 1 micron as in the first embodiment) and the P+GaAlAs layer 26 is made 1 micron thick (instead of 500 angstroms thick as in the first embodiment). With these thickness modifications, and with formation of suitably cleaved or dry etched end facets 302, 304 the layers 18, 20 and 26 and the end facets 302, 304 define an optical cavity capable of supporting edge emitting laser action. The thickness of the other layers and the doping of all of the layers is as described above for the first embodiment.

HFET devices in the form of an HFET transistor 400 and an HFET photodetector 500 can also be formed in the semiconductor layers having thicknesses modified according to the third embodiment. However, because the P−GaAlAs layer 20 is very thin and the overlying P+GaAlAs layer 26 is relatively thick in the structure according to the third embodiment, the HFET photodetector 500 will be very inefficient when illuminated through a gate opening in a direction normal to the substrate as in the first embodiment. Accordingly, in the third embodiment, the HFET photodetector is illuminated through a cleaved or dry etched edge facet 502 in a direction extending parallel to the gate, and no opening is provided in the gate contact 52. A suitable antireflection coating may be applied to the cleaved or dry etched facet 502.

Figure 12:
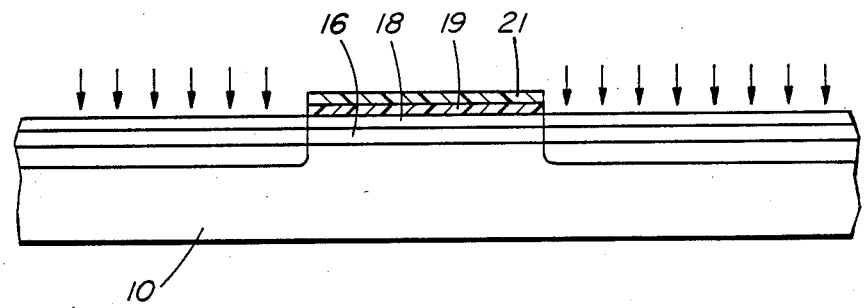
FIGS. 12 to 14 are cross-sectional views of a monolithic integrated circuit according to a fourth embodiment at successive stages in its manufacture.
Figure 13:
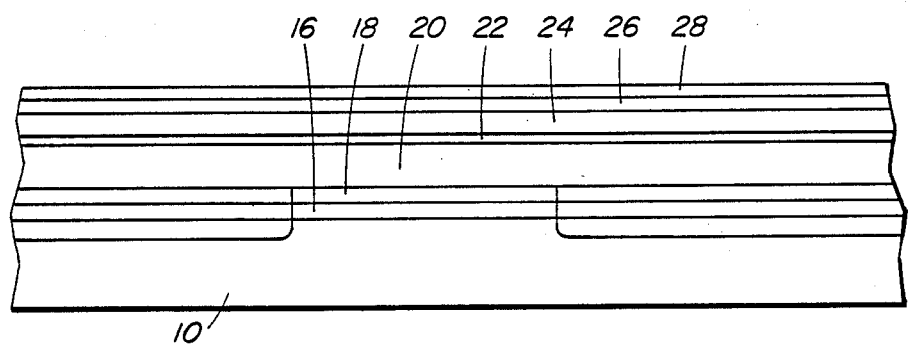
Figure 14:
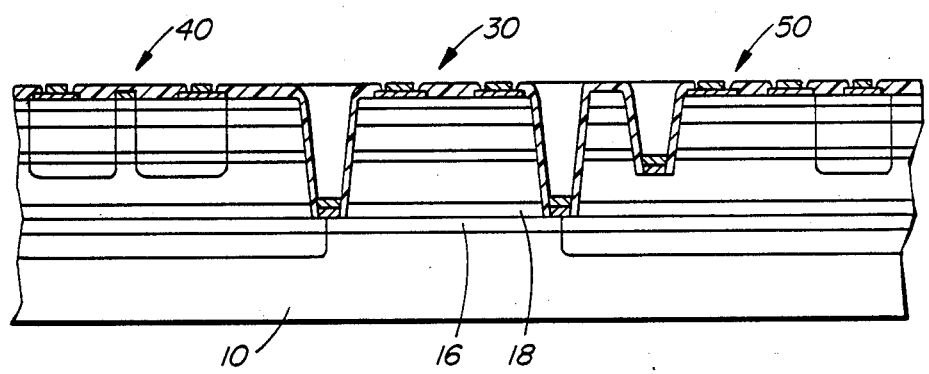

In a fourth embodiment shown in FIGS. 12 to 14, a layer 16 of N+GaAs is formed over the entire semi-insulating substrate 10, a layer 18 of N+GaAlAs is formed over the entire N+GaAs layer 16, and a layer 19 of silicon nitride is grown on the N+GaAlAs layer 18. A layer 21 of photoresist is deposited on the silicon nitride layer 19 and developed to mask only predetermined locations where DOES devices are desired. Exposed portions of the silicon nitride layer 19 are then etched away so that the silicon nitride layer 19 remains only at the predetermined locations where DOES devices are desired. Oxygen is then implanted into the N+GaAlAs and GaAs layers 16, 18 where they are not protected by the silicon nitride 19 and photoresist 21. The implanted oxygen renders the semiconducting layers 16, 18 semi-insulating except at the predetermined locations where the semiconducting layers 16, 18 are protected by the silicon nitride 19 and photoresist 21 as shown in FIG. 12.

The remaining photoresist 21 and silicon nitride 19 are then etched away to expose the semiconducting layers 16, 18, and semiconducting layers 20, 22, 24, 26 and 28 are grown as described in the first embodiment and as shown in FIG. 13. DOES devices, HFET transistor devices 40 and HFETPD devices 50 are then formed in the semiconducting layers 20, 22, 24, 26, 28 as described in the first embodiment and as shown in FIG. 14.

Numerous modifications of the embodiments described above are within the scope of the invention. For example, semiconductors other than GaAs and GaAlAs could be used. InP, InGaAs, InAlAs and other III-V semiconductors would also be appropriate for these devices.

Figure 15:
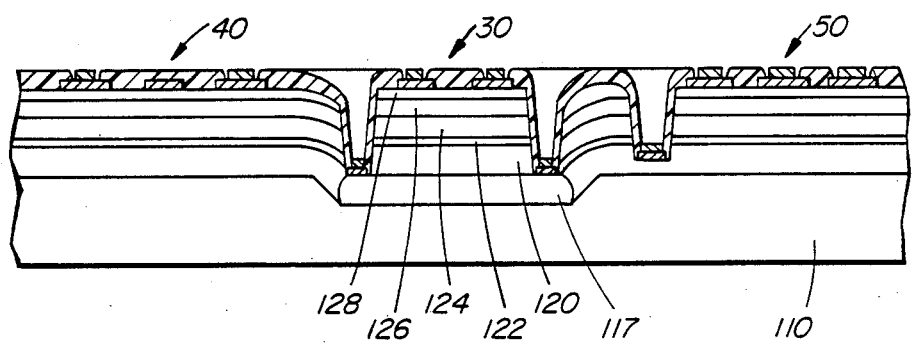
FIG. 15 is a cross-sectional view of a monolithic integrated circuit according to a fifth embodiment.

For example, an analogous integrated circuit shown in FIG. 15 could be fabricated by substituting a semi-insulating InP substrate 110 for the GaAs substrate 10, an N+InP layer 117 for the N+GaAs and GaAlAs layers 16,18, a P−InGaAsP layer 120 for the P−GaAs layer 20, a N+InP layer 122 for the sheet charge 22, a P InP layer 124 for the P GaAlAs layer 24, a P+InP layer 126 for the P+GaAlAs layer 26, and a P+InGaAs layer 128 for the P+GaAs layer 28. In such an integrated circuit, light could be coupled into and out of the optoelectronic devices through the InP substrate.

The devices described above rely on an N-type channel. Complementary devices relying on P-type channels could be formed by replacing the N-type layers with P-type layers and vice versa. The N-type channel devices are preferred due to the higher mobility of majority carriers in these devices.

Dopants other than silicon and beryllium may be used to provide the required conductivity type of the various layers.

The devices may be optically interconnected by means other than those described above. For example, Goodman et al, Proceedings of the IEEE, Vol. 72, No. 7, July 1984, pp 50-866 describes alternative optical interconnection methods.

We claim:

1. A monolithic integrated circuit comprising:
   a semi-insulating substrate having regions of wide band gap semiconductor of a first conductivity type recessed therein at specific locations;
   a layer of narrow band gap semiconductor on the substrate, the narrow band gap semiconductor having a second conductivity type opposite to the first conductivity type and contacting the regions of wide band gap semiconductor;
   a sheet charge of the first conductivity type on the layer of narrow band gap semiconductor;
   a layer of wide band gap semiconductor of the second conductivity type on the sheet charge; and
   ohmic contacts to the layer of wide band gap semiconductor of the second conductivity type and to the layer of wide band gap semiconductor of the first conductivity type defining DOES devices at the specific locations, and HFET devices formed in the semiconductor layers at other specific locations.

2. An integrated circuit as defined in claim 1, further comprising regions of narrow band gap semiconductor of the first conductivity type buried beneath the regions of wide band gap semiconductor of the first conductivity type.

3. An integrated circuit as defined in claim 1, wherein the first conductivity type is n-type and the second conductivity type is p-type.

4. An integrated circuit as defined in claim 1, wherein the narrow band gap semiconductor is GaAs and the wide band gap semiconductor is GaAlAs.

5. An integrated circuit as defined in claim 4, wherein the semiconductor of the first conductivity type is doped with Si and the semiconductor of the second conductivity type is doped with Be.

6. An integrated circuit as defined in claim 1, wherein the narrow band gap semiconductor is InGaAsP and the wide band gap semiconductor is InP.

7. An integrated circuit as defined in claim 1, wherein the sheet charge is a 30 to 60 angstrom thick layer of very highly doped semiconductor of the second conductivity type.

8. An integrated circuit as defined in claim 7, wherein the highly doped semiconductor is a wide band gap semiconductor.

9. An integrated circuit as defined in claim 1, wherein the ohmic contacts to the wide band gap semiconductor of the second conductivity type comprise a layer of heavily doped narrow band gap semiconductor of the second conductivity type on the wide band gap semiconductor of the second conductivity type and a metallic layer on the heavily doped narrow band gap semiconductor.

10. An integrated circuit as defined in claim 9, wherein at least some of the ohmic contacts have openings in the metallic layer.

11. A monolithic integrated circuit comprising:
a semi-insulating substrate having regions of wide band gap semiconductor of a first conductivity type recessed therein at specific locations;
a layer of narrow band gap semiconductor on the substrate, the narrow band gap semiconductor having a second conductivity type opposite to the first conductivity type and contacting the regions of wide band gap semiconductor;
a sheet charge of the first conductivity type on the layer of narrow band gap semiconductor;
a layer of wide band gap semiconductor of the second conductivity type on the sheet charge; and
ohmic contacts to the layer of wide band gap semiconductor of the second conductivity type and to the layer of wide band gap semiconductor of the first conductivity type defining DOES devices at the specific locations, the ohmic contacts to the wide band gap semiconductor of the first conductivity type comprising recesses extending through the wide band gap semiconductor of the second conductivity type, the sheet charge and the narrow band gap semiconductor of the second conductivity type to the wide band gap semiconductor of the first conductivity type and a metallic layer in the recesses, and HFET devices formed in the semiconductor layers at other specific locations.

12. A monolithic integrated circuit comprising:
a semi-insulating substrate having regions of wide band gap semiconductor of a first conductivity type recessed therein at specific locations and regions of narrow band gap semiconductor of the first conductivity type buried beneath the regions of the wide band gap semiconductor of the first conductivity type;
a layer of narrow band gap semiconductor on the substrate, the narrow band gap semiconductor having a second conductivity type opposite to the first conductivity type and contacting the regions of wide band gap semiconductor;
a sheet charge of the first conductivity type on the layer of narrow band gap semiconductor;
a layer of wide band gap semiconductor of the second conductivity type on the sheet charge; and
ohmic contacts to the layer of wide band gap semiconductor of the second conductivity type and to the layer of wide band gap semiconductor of the first conductivity type defining DOES devices at the specific locations, the ohmic contacts to the wide band gap semiconductor of the first conductivity type comprising recesses extending through the wide band gap semiconductor of the second conductivity type, the sheet charge, the narrow band gap semiconductor of the second conductivity type, and the wide band gap semiconductor of the first conductivity type to the narrow band gap semiconductor of the first conductivity type and a metallic layer in the recesses, and HFET device formed in the semiconductor layers at other specific locations.

13. A monolithic integrated circuit comprising:
a semi-insulating substrate having regions of wide band gap semiconductor of a first conductivity type recessed therein at specific locations;
a layer of narrow band gap semiconductor on the substrate, the narrow band gap semiconductor having a second conductivity type opposite to the first conductivity type and contacting the regions of wide band gap semiconductor;
a sheet charge of the first conductivity type on the layer of narrow band gap semiconductor;
a layer of wide band gap semiconductor of the second conductivity type on the sheet charge; and
ohmic contacts to the layer of wide band gap semiconductor of the second conductivity type and to the layer of wide band gap semiconductor of the first conductivity type defining DOES devices at the specific locations, and HFET transistor devices formed in the semiconductor layers at at least some of the other specific locations.

14. A monolithic integrated circuit comprising:
a semi-insulating substrate having regions of wide band gap semiconductor of a first conductivity type recessed therein at specific locations;
a layer of narrow band gap semiconductor on the substrate, the narrow band gap semiconductor having a second conductivity type opposite to the first conductivity type and contacting the regions of wide band gap semiconductor;
a sheet charge of the first conductivity type on the layer of narrow band gap semiconductor;
a layer of wide band gap semiconductor of the second conductivity type on the sheet charge; and
ohmic contacts to the layer of wide band gap semiconductor of the second conductivity type and to the layer of wide band gap semiconductor of the first conductivity type defining DOES devices at the specific locations, and HFETPD optical detection devices formed in the semiconductor layers at at least some of the other specific locations.

15. An integrated circuit as defined in claim 14, wherein at least some the HFETPD devices have gate contacts provided with openings therein.

16. A monolithic integrated circuit comprising:
a semi-insulating substrate having regions of wide band gap semiconductor of a first conductivity type recessed therein at specific locations;
a layer of narrow band gap semiconductor on the substrate, the narrow band gap semiconductor having a second conductivity type opposite to the first conductivity type and contacting the regions of wide band gap semiconductor;
a sheet charge of the first conductivity type on the layer of narrow band gap semiconductor;
a layer of wide band gap semiconductor of the second conductivity type on the sheet charge; and
ohmic contacts to the layer of wide band gap semiconductor of the second conductivity type and to the layer of wide band gap semiconductor of the first conductivity type defining DOES devices at the specific locations, and HFET devices formed in the semiconductor layers at other specific locations; and optical waveguides optically interconnecting at least some of the devices.

17. An integrated circuit as defined in claim 16, comprising optical waveguides carried at an upper surface of the integrated circuit, sad optical waveguides being optically coupled to at least some of the DOES and HFET devices so as to optically interconnect at least some of the devices.

* * * * *